United States Patent
Huang et al.

(10) Patent No.: US 8,822,328 B1
(45) Date of Patent: Sep. 2, 2014

(54) METHOD FOR PATTERNING SEMICONDUCTOR STRUCTURE

(71) Applicant: United Microelectronics Corp., Hsinchu (TW)

(72) Inventors: Chia-Wei Huang, Kaohsiung (TW); Ming-Jui Chen, Hsinchu (TW); Ting-Cheng Tseng, Tainan (TW); Ping-I Hsieh, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/787,912

(22) Filed: Mar. 7, 2013

(51) Int. Cl.
*H01L 21/4763* (2006.01)
*H01L 21/302* (2006.01)
*H01L 21/308* (2006.01)

(52) U.S. Cl.
CPC .................................. *H01L 21/308* (2013.01)
USPC ........... 438/618; 438/620; 438/622; 438/694; 438/700; 438/702; 438/703

(58) Field of Classification Search
CPC ................. H01L 21/31105; H01L 21/31144; H01L 21/76808
See application file for complete search history.

(56) References Cited

U.S. PATENT DOCUMENTS

| | | | |
|---|---|---|---|
| 7,247,887 B2 | 7/2007 | King et al. | |
| 7,417,288 B2 * | 8/2008 | Dennard et al. | 257/365 |
| 2007/0020565 A1 | 1/2007 | Koh et al. | |
| 2007/0158756 A1 | 7/2007 | Dreeskornfeld et al. | |
| 2008/0248429 A1 | 10/2008 | Chou et al. | |
| 2009/0233238 A1 | 9/2009 | Hsu et al. | |
| 2009/0258500 A1 | 10/2009 | Yang et al. | |
| 2011/0195576 A1 * | 8/2011 | Ko et al. | 438/702 |
| 2012/0302057 A1 * | 11/2012 | Arnold et al. | 438/637 |
| 2013/0337651 A1 * | 12/2013 | Ko et al. | 438/702 |

* cited by examiner

*Primary Examiner* — Duy Deo
(74) *Attorney, Agent, or Firm* — WPAT, PC; Justin King

(57) ABSTRACT

A method for patterning a semiconductor structure is provided. The method comprises following steps. A first mask defining a first pattern in a first region and a second pattern in a second region adjacent to the first region is provided. The first pattern defined by the first mask is transferred to a first film structure in the first region, and the second pattern defined by the first mask is transferred to the first film structure in the second region. A second film structure is formed on the first film structure. A second mask defining a third pattern in the first region is provided. At least 50% of a part of the first region occupied by the first pattern defined by the first mask is identical with a part of the first region occupied by the third pattern defined by the second mask.

18 Claims, 4 Drawing Sheets

METHOD FOR PATTERNING SEMICONDUCTOR STRUCTURE

BACKGROUND

1. Technical Field

The disclosure relates to a method for patterning a semiconductor structure, and more particularly to a method using two masks having similar patterns for patterning a semiconductor structure.

2. Description of the Related Art

For forming a designed integrated circuit to a semiconductor wafer, a mask formed with a design layout pattern is provided. The layout pattern defined by the mask is transferred on to a photoresist layer on a surface of a semiconductor structure and then transferred into the semiconductor structure by photolithography processes. Therefore, the photolithography process is an important key for the semiconductor manufacturing.

The critical dimension (CD) of the pattern for the mask is limited to the resolution limit of the optical exposure tool. With the trend towards high integration and small pattern of the circuit design, the deviation or the distortion of the pattern transferred into the semiconductor structure occur more easily due to the optical proximity effect (OPE) during exposing the mask having high pattern density. The electrical characteristic of the device is affected by the distortion.

SUMMARY

The disclosure is directed to a method for patterning a semiconductor structure. The semiconductor structure can have a desired pattern transferred from a mask.

According to an aspect the disclosure, a method for patterning a semiconductor structure is provided. The method comprises following steps. A first mask defining a first pattern in a first region and a second pattern in a second region adjacent to the first region is provided. The first pattern defined by the first mask is transferred to a first film structure in the first region, and the second pattern defined by the first mask is transferred to the first film structure in the second region. A second film structure is formed on the first film structure. A second mask defining a third pattern in the first region is provided. At least 50% of a part of the first region occupied by the first pattern defined by the first mask is identical with a part of the first region occupied by the third pattern defined by the second mask. The third pattern defined by the second mask is transferred to the second film structure in the first region. The third pattern in the second film structure is transferred to the first film structure.

According to an another aspect the disclosure, a method for patterning a semiconductor structure is provided. The method comprises following steps. A first mask defining a first pattern in a first region and a second pattern in a second region adjacent to the first region is provided. The first pattern defined by the first mask is transferred to a first film structure in the first region, and the second pattern defined by the first mask is transferred to the first film structure in the second region. A second film structure is formed on the first film structure. A second mask defining a third pattern in the first region is provided. At least 50% of a projection region to the first film structure from the first pattern defined by the first mask is overlapped with a projection region to the second film structure from the third pattern defined by the second mask. The third pattern defined by the second mask is transferred to the second film structure in the first region. The third pattern in the second film structure is transferred to the first film structure.

According to yet another aspect the disclosure, a method for patterning a semiconductor structure is provided. The method comprises following steps. A first mask defining a first pattern in a first region and a second pattern in a second region adjacent to the first region is provided. The first pattern defined by the first mask is transferred to a first film structure in the first region, and the second pattern defined by the first mask is transferred to the first film structure in the second region. A second film structure is formed on the first film structure. A second mask defining a third pattern in the first region is provided. At least 50% of a region of the first pattern defined by the first mask is corresponded with a region of the third pattern defined by the second mask. The third pattern defined by the second mask is transferred to the second film structure in the first region. The third pattern in the second film structure is transferred to the first film structure.

DETAILED DESCRIPTION

FIGS. 1~8 illustrate a method for patterning a semiconductor structure according to one embodiment.

Figure 1:
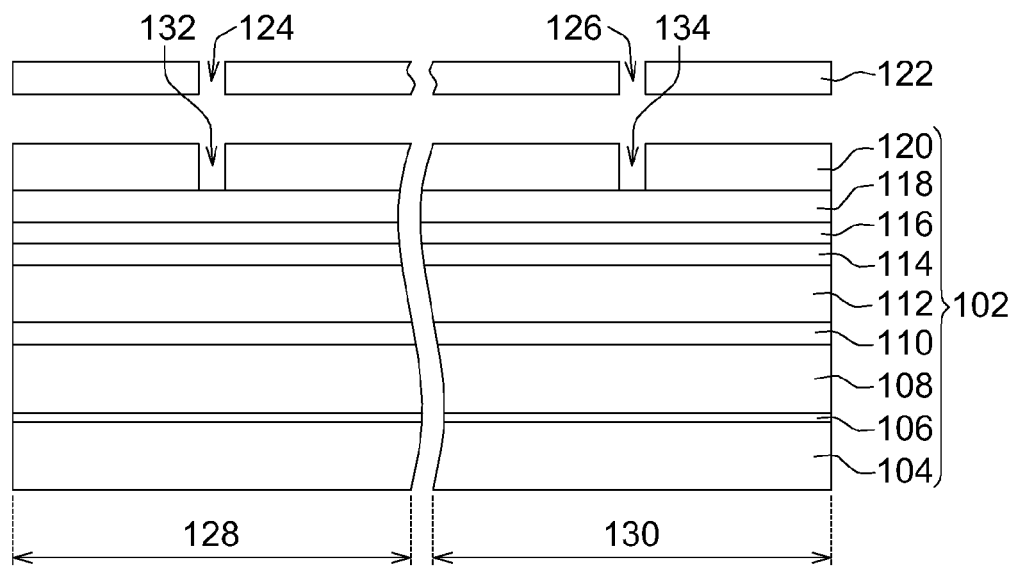
FIGS. 1~8 illustrate a method for patterning a semiconductor structure according to one embodiment.

Referring to FIG. 1, a first film structure 102 may comprise a substrate 104, a dielectric layer 106, a hard mask layer 108, a dielectric layer 110, a hard mask layer 112, an etching stop layer 114, a dielectric layer 116, an anti-reflection layer 118 and a photoresist layer 120. For example, the substrate 104 may comprise a silicon substrate or other suitable semiconductor substrates. The dielectric layer 106 may comprise a pad oxide. The hard mask layer 108 may comprise a nitride such as silicon nitride. The dielectric layer 110 may comprise an oxide such as silicon oxide. The hard mask layer 112 may comprise an advanced patterning film (APF) (Applied Materials Inc.). The etching stop layer 114 may comprise an oxide such as SiOC. The dielectric layer 116 may comprise an oxide such as silicon oxide. The anti-reflection layer 118 may comprise a bottom anti-reflective coating (BARC).

A first mask 122 is provided. The first mask 122 defines a first pattern 124 in a first region 128 and a second pattern 126 in a second region 130 adjacent to the first region 128. In one embodiment, the first region 128 is corresponded with a region for a wider feature such as non-critical feature, for example, comprising a dummy pattern region or a device region such as a logic device region. The second region 130 is corresponded with a device region for a narrower feature such as critical feature, for example, comprising a SRAM device region. For example, for 20 nm generation, the line width for the critical region may be about 40 nm, the line space may be about 50 nm. In addition, the line width and the line space for the non-critical region may be larger than about 200 nm.

Referring to FIG. 1, the first pattern 124 defined by the first mask 122 may be transferred to the first film structure 102 to form a first pattern 132 in the photoresist layer 120 in the first region 128, and the second pattern 126 defined by the first mask 122 may be transferred to the first film structure 102 to form a second pattern 134 in the photoresist layer 120 in the second region 130 by a photolithography process.

Figure 2:
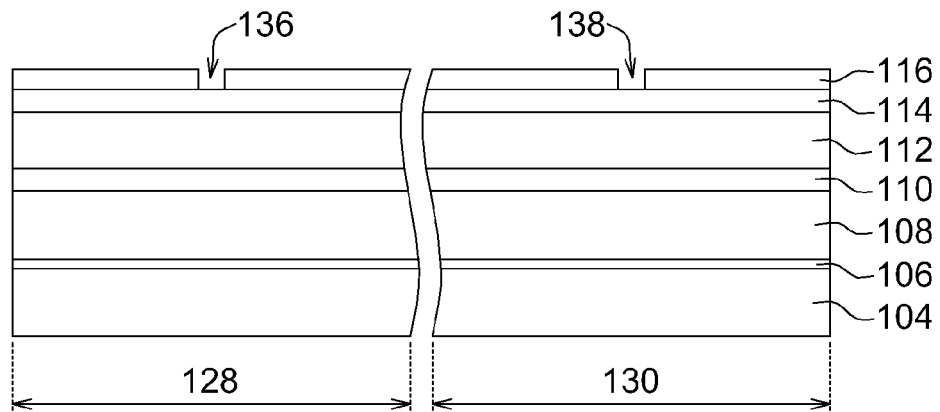

Referring to FIG. 2, the first pattern 132 in the photoresist layer 120 is transferred down to the dielectric layer 116 to form a first pattern 136 in the first region 128, and the second pattern 134 in the photoresist layer 120 is transferred down to the dielectric layer 116 to form a second pattern 138 in the second region 130 by an etching step using the photoresist layer 120 as an etching mask. This etching step may stop at the etching stop layer 114 substantially. Next, the anti-reflection layer 118 and the photoresist layer 120 may be removed.

Figure 3:
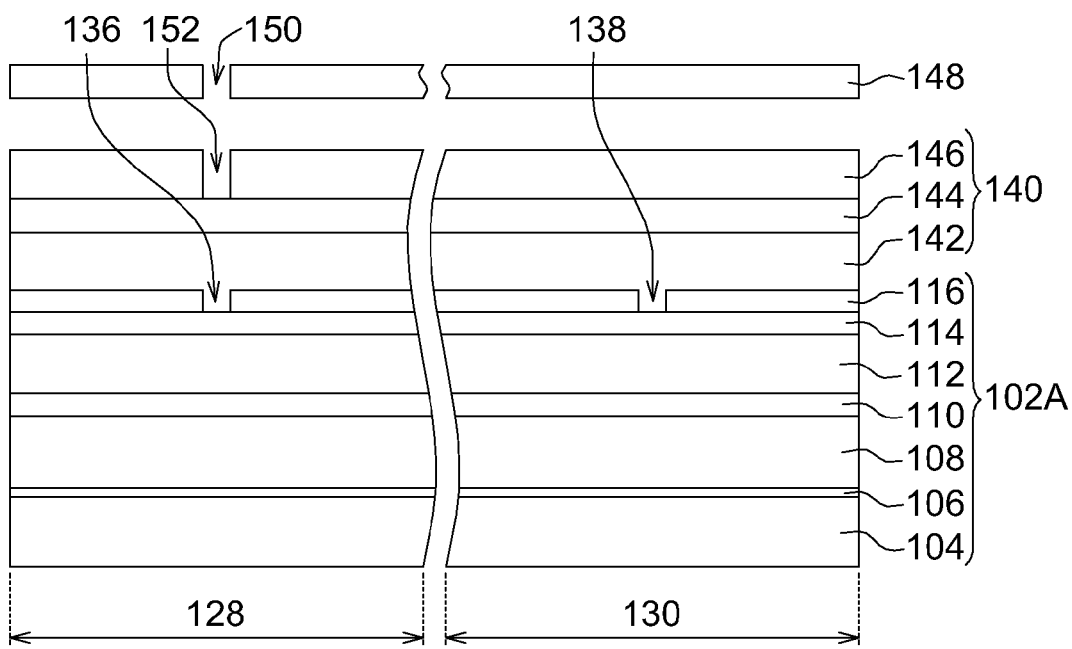

Referring to FIG. 3, a second film structure 140 may be formed on the first film structure 102A. The second film structure 140 may comprise a mask layer 142, an anti-reflection layer 144 and a photoresist layer 146. The mask layer 142 may comprise an I-line material sensitive to light of 365 nm. The anti-reflection layer 144 may be a single-layer or multi-layer anti-reflection layer, comprising organosilicon polymer or polysilane. The photoresist layer 146 may be a ArF photoresist or a 193 nm photoresist.

Referring to FIG. 3, a second mask 148 is provided. The second mask 148 defines a third pattern 150 in the first region 128. In addition, the second mask 148 defines no pattern in the second region 130. The third pattern 150 defined by the second mask 148 is transferred to the second film structure 140 to form a third pattern 152 in the photoresist layer 146 in the first region 128 by a photolithography process.

Figure 4:
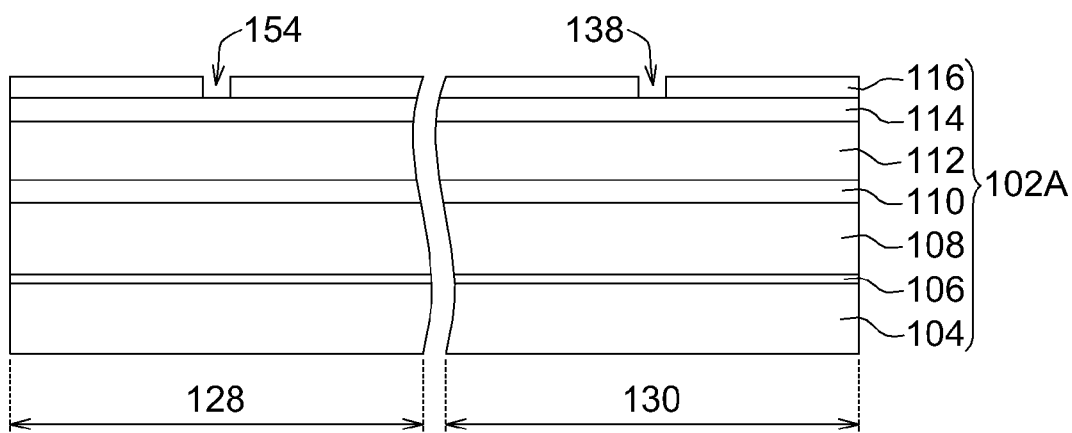

Referring to FIG. 4, the third pattern 152 in the photoresist layer 146 is transferred to the first film structure 102A to form a film pattern 154, formed from the first pattern 136 and the third pattern 152, in the dielectric layer 116 in the first region 128. For example, the process for transferring the third pattern 152 (FIG. 3) comprises following steps. Third pattern 152 is transferred to the anti-reflection layer 144 by an etching step using the photoresist layer 146 as an etching mask, and the mask layer 142 may be used as an etching stop layer for this etching step. Next, the anti-reflection layer 144 having the third pattern (not shown) may be used as an etching mask for an etching step for transferring the third pattern to the mask layer 142 and using the etching stop layer 114 as an etching stop layer. The remaining photoresist layer 146 may be removed by this etching step. Next, the anti-reflection layer 144 may be removed. Next, the mask layer 142 having the third pattern (not shown) may be used as an etching mask for an etching step for transferring the third pattern to the dielectric layer 116. This etching step may stop at the etching stop layer 114. Next, the mask layer 142 may be removed to expose the dielectric layer 116 having the film pattern 154 and the second pattern 138 in the first region 128 and the second region 130 respectively as shown in FIG. 4.

In embodiments, the first mask 122 (FIG. 1) and the second mask 148 (FIG. 3) are designed to have similar patterns in the first region 128. In addition, in the second region 130, only the first mask 122 has a pattern, in other words, the second mask 148 has no mask in the second region 130. This design is used for the patterning process so as to avoid distortion to the pattern transferred to the semiconductor structure, such as the film pattern 154 and the second pattern 138 in the dielectric layer 116 of the first film structure 102A, resulted from the mask pattern density issue. The effect is more noticeable for the second region 130 (the SRAM device region) for the critical pattern such as the second pattern 138. For example, at least 50% of a part of the first region 128 occupied by the first pattern 124 defined by the first mask 122 is identical with a part of the first region 128 occupied by the third pattern 150 defined by the second mask 148. Otherwise, at least 50% of a projection region to the first film structure 102 from the first pattern 124 defined by the first mask 122 is overlapped with a projection region to the second film structure 140 from the third pattern 150 defined by the second mask 148. Otherwise, at least 50% of a region of the first pattern 124 defined by the first mask 122 is corresponded with a region of the third pattern 150 defined by the second mask 148. In embodiments, the higher similarity degree the patterns defined by the first mask 122 and the second mask 148 in the first region 128 have, the less distortion degree resulted from the mask pattern issue the pattern transferred to the semiconductor structure suffers, that is, more desired pattern the patterning process can provide to the semiconductor structure. In some embodiments, for example, the part of the first region 128 occupied by the first pattern 124 defined by the first mask 122 is wholly identical with the part of the first region 128 occupied by the third pattern 150 defined by the second mask 148 substantially. Otherwise, the projection region to the first film structure 102 from the first pattern 124 defined by the first mask 122 is wholly overlapped with the projection region to the second film structure 140 from the third pattern 150 defined by the second mask 148 substantially. Otherwise, the first pattern 124 defined by the first mask 122 is wholly corresponded with the third pattern 150 defined by the second mask 148 substantially.

In embodiments, the film pattern 154 (FIG. 4) formed by transferring the first pattern 124 defined by the first mask 122 (FIG. 1) and the third pattern 150 defined by the second mask 148 (FIG. 3) is configured to be in the first region 128 of non-critical, for example, comprising the dummy pattern region or the logic device region, and therefore can tolerate an alignment adjust shift (AA-shift) from alignment error. In other words, this feature shift would not affect the electrical characteristics of the integrated circuit. For example, for the 20 nm generation, the specification for the AA-shift is limited to be smaller than about 5 nm.

Figure 5:
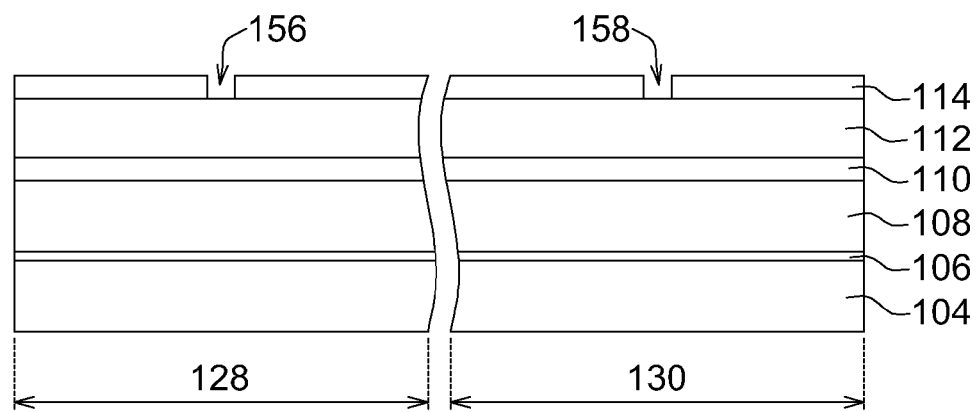

Referring to FIG. 5, the film pattern 154 and the second pattern 138 in the dielectric layer 116 may be transferred down to the etching stop layer 114 to form a film pattern 156 and a second pattern 158 by an etching step. Next, the dielectric layer 116 is removed.

Figure 6:
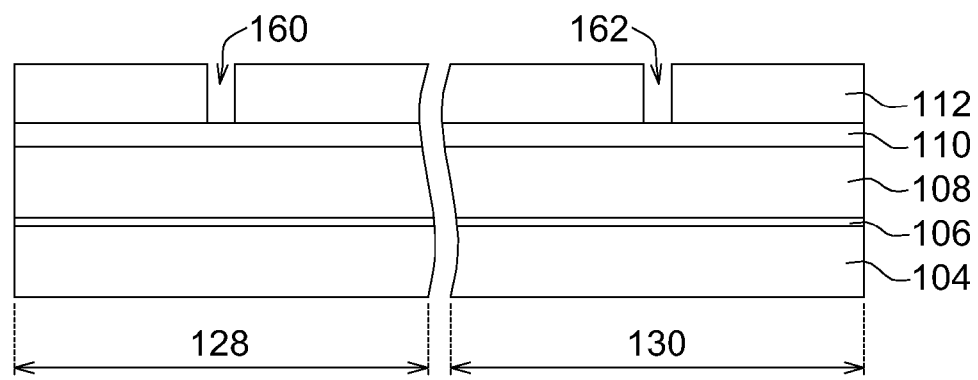

Referring to FIG. 6, the film pattern 156 and the second pattern 158 in the etching stop layer 114 are transferred down to the hard mask layer 112 to form a film pattern 160 and a second pattern 162 by an etching step using the etching stop layer 114 as an etching mask. Next, the etching stop layer 114 may be removed.

Figure 7:
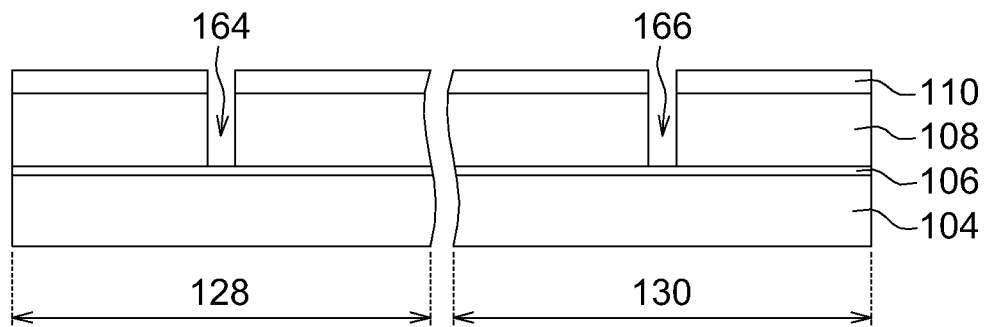

Referring to FIG. 7, the film pattern 160 and the second pattern 162 in the hard mask layer 112 are transferred down to the hard mask layer 108 to form a film pattern 164 and a second pattern 166 by an etching step using the hard mask layer 112 as an etching mask. Next, the hard mask layer 112 may be removed.

Figure 8:
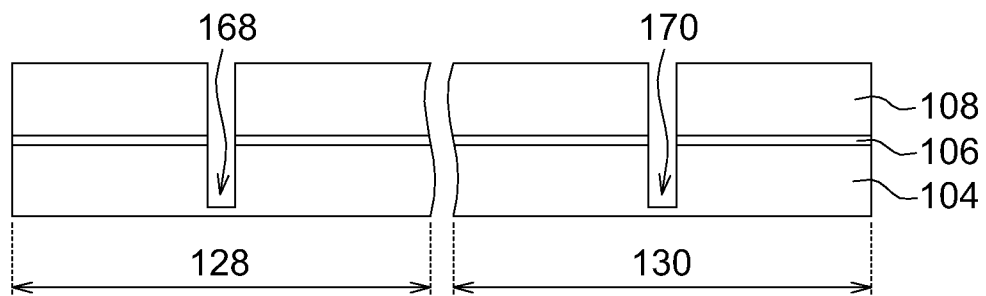

Referring to FIG. 8, the film pattern 164 and the second pattern 166 in the hard mask layer 108 are transferred down to the substrate 104 to form a film pattern 168 and a second pattern 170 by an etching step using the hard mask layer 108 as an etching mask. The remaining dielectric layer 110 on the hard mask layer 108 can assist the substrate 104, the dielectric layer 106 and the hard mask layer 108 in having good corner shape after this etching step. After this etching step, the dielectric layer 110 may be removed.

According to the above method for pattering the semiconductor structure in embodiments, the desired pattern can be transferred to the semiconductor structure, and the pattern distortion problem due to the mask pattern density issue can be avoided.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for patterning a semiconductor structure, comprising:
   providing a first mask defining a first pattern in a first region and a second pattern in a second region adjacent to the first region;
   transferring the first pattern defined by the first mask to a first film structure in the first region and the second pattern defined by the first mask to the first film structure in the second region;
   forming a second film structure on the first film structure;
   providing a second mask defining a third pattern in the first region, wherein at least 50% of a part of the first region occupied by the first pattern defined by the first mask is identical with a part of the first region occupied by the third pattern defined by the second mask;
   transferring the third pattern defined by the second mask to the second film structure in the first region;
   transferring the third pattern in the second film structure to the first film structure; and
   transferring the second pattern and a film pattern composed of the first pattern and the third pattern all landing on the same level of an upper portion of the first film structure down into a lower portion of the first film structure at the same time.

2. The method for patterning the semiconductor structure according to claim 1, wherein the part of the first region occupied by the first pattern defined by the first mask is wholly identical with the part of the first region occupied by the third pattern defined by the second mask substantially.

3. The method for patterning the semiconductor structure according to claim 1, wherein the second mask in the second region defines no pattern.

4. The method for patterning the semiconductor structure according to claim 1, furthering comprising removing the second film structure after transferring the third pattern in the second film structure to the first film structure.

5. The method for patterning the semiconductor structure according to claim 1, wherein the film pattern is in the first region.

6. The method for patterning the semiconductor structure according to claim 1, wherein after transferring the third pattern in the second film structure to the first film structure, the first film structure in the second region has the second pattern.

7. The method for patterning the semiconductor structure according to claim 1, wherein the first region comprises a logic device region or a dummy pattern region, the second region comprises a SRAM device region.

8. The method for patterning the semiconductor structure according to claim 1, wherein the first region is a non-critical region, the second region is a critical region.

9. A method for patterning a semiconductor structure, comprising:
   providing a first mask defining a first pattern in a first region and a second pattern in a second region adjacent to the first region;
   transferring the first pattern defined by the first mask to a first film structure in the first region and the second pattern defined by the first mask to the first film structure in the second region;
   forming a second film structure on the first film structure;
   providing a second mask defining a third pattern in the first region, wherein at least 50% of a projection region to the first film structure from the first pattern defined by the first mask is overlapped with a projection region to the second film structure from the third pattern defined by the second mask;
   transferring the third pattern defined by the second mask to the second film structure in the first region;
   transferring the third pattern in the second film structure to the first film structure; and
   transferring the second pattern and a film pattern composed of the first pattern and the third pattern all landing on the same level of an upper portion of the first film structure down into a lower portion of the first film structure at the same time.

10. The method for patterning the semiconductor structure according to claim 9, wherein the projection region to the first film structure from the first pattern defined by the first mask is wholly overlapped with the projection region to the second film structure from the third pattern defined by the second mask substantially.

11. The method for patterning the semiconductor structure according to claim 9, wherein the second mask in the second region defines no pattern.

12. The method for patterning the semiconductor structure according to claim 9, wherein the first region comprises a logic device region or a dummy pattern region, the second region comprises a SRAM device region.

13. The method for patterning the semiconductor structure according to claim 9, wherein the first region is a non-critical region, the second region is a critical region.

14. A method for patterning a semiconductor structure, comprising:
   providing a first mask defining a first pattern in a first region and a second pattern in a second region adjacent to the first region;
   transferring the first pattern defined by the first mask to a first film structure in the first region and the second pattern defined by the first mask to the first film structure in the second region;
   forming a second film structure on the first film structure;
   providing a second mask defining a third pattern in the first region, wherein at least 50% of a region of the first pattern defined by the first mask is corresponded with a region of the third pattern defined by the second mask;
   transferring the third pattern defined by the second mask to the second film structure in the first region;
   transferring the third pattern in the second film structure to the first film structure; and
   transferring the second pattern and a film pattern composed of the first pattern and the third pattern all landing on the same level of an upper portion of the first film structure down into a lower portion of the first film structure at the same time.

15. The method for patterning the semiconductor structure according to claim 14, wherein the first pattern defined by the first mask is wholly corresponded with the third pattern defined by the second mask substantially.

16. The method for patterning the semiconductor structure according to claim 14, wherein the second mask in the second region defines no pattern.

17. The method for patterning the semiconductor structure according to claim 14, wherein the first region comprises a logic device region or a dummy pattern region, the second region comprises a SRAM device region.

18. The method for patterning the semiconductor structure according to claim 14, wherein the first region is a non-critical region, the second region is a critical region.

* * * * *